US008975636B2

(12) United States Patent
Kim et al.

(10) Patent No.: US 8,975,636 B2
(45) Date of Patent: Mar. 10, 2015

(54) ORGANIC LIGHT EMITTING DISPLAY DEVICE HAVING REFLECTION STRUCTURE AND METHOD OF MANUFACTURING ORGANIC LIGHT EMITTING DISPLAY DEVICE HAVING REFLECTION STRUCTURE

(75) Inventors: Il-Nam Kim, Yongin-Si (KR); Won-Sang Park, Yongin-Si (KR); Min-Woo Kim, Yongin-Si (KR); Soo-Min Baek, Yongin-Si (KR); Jae-Kyoung Kim, Yongin-Si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 13/415,745

(22) Filed: Mar. 8, 2012

(65) Prior Publication Data
US 2013/0049028 A1 Feb. 28, 2013

(30) Foreign Application Priority Data

Aug. 30, 2011 (KR) ........................ 10-2011-0086797

(51) Int. Cl.
H01L 29/04 (2006.01)
H01L 31/0368 (2006.01)
H01L 27/32 (2006.01)
H01L 51/52 (2006.01)

(52) U.S. Cl.
CPC ........ H01L 27/3246 (2013.01); H01L 51/5209 (2013.01); H01L 51/5218 (2013.01)
USPC .. 257/72; 257/59; 257/E27.117; 257/E27.119

(58) Field of Classification Search
USPC ........................ 257/59, 72, E27.117, E27.119
See application file for complete search history.

(56) References Cited

U.S. PATENT DOCUMENTS

| 8,039,839 | B2 * | 10/2011 | Kwon ............................. 257/59 |
| 8,309,976 | B2 * | 11/2012 | Yamazaki et al. ............... 257/83 |
| 2005/0161680 | A1 * | 7/2005 | Kawakami et al. ............. 257/79 |
| 2006/0202610 | A1 * | 9/2006 | Karasawa et al. ............. 313/498 |
| 2009/0066237 | A1 | 3/2009 | Kambe et al. |
| 2009/0115348 | A1 * | 5/2009 | Yamazaki et al. ............. 315/297 |
| 2009/0134399 | A1 * | 5/2009 | Sakakura et al. ............... 257/72 |
| 2010/0207149 | A1 * | 8/2010 | Kim et al. ........................ 257/98 |
| 2011/0215330 | A1 * | 9/2011 | Shin et al. ........................ 257/59 |
| 2011/0309339 | A1 * | 12/2011 | You et al. ........................ 257/40 |
| 2013/0069067 | A1 * | 3/2013 | Youn .................................. 257/59 |
| 2013/0119389 | A1 * | 5/2013 | Yamazaki et al. ............... 257/59 |
| 2013/0126842 | A1 * | 5/2013 | Takeuchi et al. ................ 257/40 |

* cited by examiner

FOREIGN PATENT DOCUMENTS

| KR | 10-2003-0052621 A | 6/2003 |
| KR | 10-2006-0093529 A | 8/2006 |
| KR | 10-2009-0027594 A | 3/2009 |

*Primary Examiner* — Matthew W Such
*Assistant Examiner* — Samuel Lair
(74) *Attorney, Agent, or Firm* — Knobbe, Martens, Olson & Bear, LLP

(57) ABSTRACT

An organic light emitting display device may include a substrate having a switching device, a first electrode including a reflection structure and being electrically connected to the switching device, a pixel defining layer disposed on the first electrode to define a luminescent region and a nonluminescent region, an organic light emitting structure disposed over the pixel defining layer, and a second electrode disposed over the organic light emitting structure. The first electrode may include the reflection structure such as a recess structure or a protrusion structure, so that the organic light emitting display device may ensure an enhanced light efficiency. Additionally, pixels of the organic light emitting display device may have improved uniformity because an opening of the pixel defining layer may have a rounded shape.

15 Claims, 7 Drawing Sheets

ORGANIC LIGHT EMITTING DISPLAY DEVICE HAVING REFLECTION STRUCTURE AND METHOD OF MANUFACTURING ORGANIC LIGHT EMITTING DISPLAY DEVICE HAVING REFLECTION STRUCTURE

CROSS-REFERENCE TO RELATED APPLICATION

This application claims priority under 35 USC §119 to Korean Patent Application No. 10-2011-0086797 filed on Aug. 30, 2011 in the Korean Intellectual Property Office (KIPO), the contents of which are herein incorporated by reference in its entirety.

BACKGROUND

1. Field

The present disclosure relates to organic light emitting display (OLED) devices and methods of manufacturing organic light emitting display devices.

2. Related Technology

Among various flat panel display devices, an organic light emitting display (OLED) device generally has advantages such as a high response speed, a low power consumption and a wide view angle, so that the organic light emitting display devices are widely used in various electric and electronic apparatuses. An organic light emitting display device may have a construction in which an anode and a cathode successively disposed on an insulation layer covering a thin film transistor (TFT) provided on a substrate. An organic light emitting layer is interposed between the anode and the cathode. However, a light generated from the organic light emitting layer may be at least partially reflected between the electrodes, and thus a light efficiency of the organic light emitting display device may be reduced. For example, the organic light emitting display device may have a relatively poor light efficiency of about 17% based on a total quantity of the light generated from the organic light emitting layer.

To improve the light efficiency of the organic light emitting display device, a bank having an inclined sidewall or a protruding bank may be disposed between adjacent pixels of the organic light emitting display device so as to increase an effective area of the organic light emitting layer in a display region of the organic light emitting display device. However, the bank having the inclined sidewall of the protruding bank does not reflect the light progressing toward a non-display region of the organic light emitting display device. Therefore, the light efficiency of the organic light emitting display is not be sufficiently increased, Further, the organic light emitting layer and an electrode are not uniformly formed on the bank having the inclined sidewall of the protruding bank, thereby deteriorating uniformities of the pixels of the organic light emitting display device. The foregoing discussion in the background section is to provide background information, and does not constitute an admission of prior art.

SUMMARY

Embodiments provide an organic light emitting display device including an electrode having a reflection structure such as a recess structure or a protrusion structure to improve a light efficiency and uniformities of pixels.

Embodiments provide a method of manufacturing an organic light emitting display device including an electrode having a reflection structure such as a recess structure or a protrusion structure to improve a light efficiency and uniformities of pixels.

According to embodiments, there is provided an organic light emitting display device including a substrate, a first electrode, a pixel defining layer, an organic light emitting structure and a second electrode. The substrate may have a switching device formed thereon. The first electrode may be electrically connected to the switching device. The first electrode may include a reflection structure. The pixel defining layer may be disposed over the first electrode. The pixel defining layer may define a luminescent region and a nonluminescent region. The organic light emitting structure may be disposed over the pixel defining layer. The second electrode may be disposed over the organic light emitting structure.

In embodiments, the reflection structure of the first electrode may be configured to reflect at least part of a light generated from the organic light emitting structure and headed to the nonluminescent region toward the luminescent region.

In embodiments, the reflection structure may include a recess structure and the pixel defining layer may include an opening exposing at least a portion of the first electrode in the luminescent region. The opening of the pixel defining layer may have a substantially rounded sidewall and the organic light emitting structure may be located over the exposed portion of the first electrode along a shape of the opening of the pixel defining layer. The first electrode may include a first electrode film pattern, a second electrode film pattern, the recess structure and a third electrode film pattern. The first electrode film pattern may be electrically connected to the switching device. The second electrode film pattern may be disposed over the first electrode film pattern. The recess structure may be disposed on the second electrode film pattern in the luminescent region. The third electrode film pattern may be disposed in the recess structure. Each of the first and the third electrode film patterns may include a transparent conductive material. Here, the second electrode film pattern may include a reflective material. The second electrode may include a material substantially the same as a material of the first electrode film pattern or a material of the third electrode film pattern. A sidewall of the reflection structure may have a first angle of inclination relative to a plane substantially parallel to the substrate, and the opening of the pixel defining layer may have a second angle of inclination substantially greater than the first angle of inclination. A ratio between the first angle of inclination and the second angle of inclination may be in a range of about 0.3:1.0 to about 1.0:4.0. A ratio of a thickness of the first electrode in the nonluminescent region relative to a thickness of the pixel defining layer in the non-luminescent region may be below about 1.0.

In embodiments, the reflection structure of the first electrode may include a protrusion structure. In this case, the first electrode may include a first electrode film pattern and a second electrode film pattern having the protrusion structure. The first electrode film pattern may be electrically connected to the switching device. The protrusion structure may protrude from the first electrode film pattern. The first electrode film pattern may include a transparent conductive material and the second electrode film pattern may include a reflective material. The second electrode may include a material substantially the same as that of the second electrode film pattern. The pixel defining layer may include a first portion and a second portion. Here, the first portion may substantially enclose or cover a portion of the second electrode film pattern and define the luminescent region, and the second portion may be located on the first electrode film pattern and define the nonluminescent region. The first portion of the pixel defining layer may have a substantially rounded shape. A ratio of a width of the first portion relative to a thickness of the first portion may be above about 1.0. A ratio of a thickness of the second portion relative to a thickness of the second electrode film pattern may be substantially equal to or smaller than about 1.0.

According to embodiments, there is provided a method of manufacturing an organic light emitting display device. In the method of manufacturing the organic light emitting display device, a switching device may be formed over a substrate. An insulation layer may be formed over the substrate to cover the switching device. A first electrode having a recess structure may be formed over the insulation layer. The first electrode may be electrically connected to the switching device. A pixel defining layer may be formed over the insulation layer to partially expose a portion of the first electrode. An organic light emitting structure may be formed over the exposed portion of the first electrode and the pixel defining layer. A second electrode may be formed over the organic light emitting structure.

In forming of the first electrode according to embodiments, a first electrode film may be formed over the insulation layer. A second electrode film may be formed over the first electrode film. A first electrode film pattern and a second electrode film pattern may be formed over the insulation layer by patterning the first electrode film and the second electrode film. The recess structure may be formed over the second electrode film pattern. A third electrode film pattern may be formed in the recess structure. The recess structure may be formed by a dry etching process. The recess structure may be formed while patterning the first and the second films to form the first and the second electrode film patterns.

In forming of the pixel defining layer according to embodiments, an opening may be formed to expose at least a portion of the third electrode film pattern by partially etching the pixel defining layer.

According to embodiments, there is provided a method of manufacturing an organic light emitting display device. In the method of manufacturing the organic light emitting display device, a switching device may be formed over a substrate. An insulation layer may be formed over the substrate to cover the switching device. A first electrode having a protrusion structure may be formed over the insulation layer. The first electrode may be electrically connected to the switching device. A pixel defining layer may be formed over the insulation layer and the first electrode. An organic light emitting structure may be formed over the pixel defining layer. A second electrode may be formed over the organic light emitting structure.

In forming of the first electrode according to embodiments, a first electrode film may be formed over the insulation layer. A second electrode film may be formed over the first electrode film. A second electrode film pattern having the protrusion structure may be formed over the first electrode film by patterning the second electrode film. A first electrode film pattern may be formed over the insulation layer by patterning the first electrode film. The second electrode film pattern may be formed while forming the first electrode film pattern. The pixel defining layer may be formed over the first electrode film pattern to substantially enclose or cover the second electrode film pattern.

According to embodiments, the organic light emitting display device may include the first electrode having the reflection structure such as the recess structure or the protrusion structure, so that the organic light emitting display device may have a light efficiency increased by more than about 50% in comparison with that of the conventional organic light emitting display devices. Additionally, the pixel defining electrode of the organic light emitting display device may have a substantially rounded shape, such that pixels, the organic light emitting structure and the second electrode of the organic light emitting display device may ensure enhanced uniformities.

BRIEF DESCRIPTION OF THE DRAWINGS

Embodiments will be more clearly understood from the following detailed description taken in conjunction with the accompanying drawings.

FIGS. 1 to 7 are cross-sectional views illustrating a method of manufacturing an organic light emitting display device in accordance with embodiments.

DESCRIPTION OF EMBODIMENTS

Figure 1:
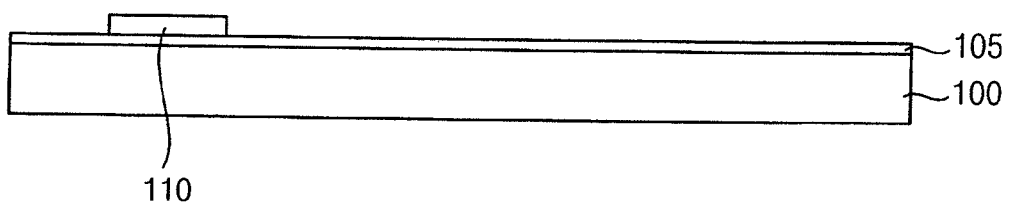
FIGS. 1 to 7 represent non-limiting, embodiments as described herein.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 7 are cross-sectional views illustrating a method of manufacturing an organic light emitting display device in accordance with embodiments.

Referring to FIG. 1, a buffer layer 105 may be formed on a substrate 100. The substrate 100 may include a transparent insulation substrate. For example, the substrate 100 may include a glass substrate, a quartz substrate, a transparent resin substrate, etc. Examples of the transparent resin substrate for the substrate 100 may include polyimide-based resin, acryl-based resin, polyacrylate-based resin, polycarbonate-based resin, polyeter-based resin, polyethylene-terephthalate-based resin, sulfonic acid-based resin, etc.

In some embodiments, a planarization process may be performed for the substrate 100 before forming the buffer layer 105 on the substrate 100. For example, a chemical mechanical polishing (CMP) process and/or an etch back process may be executed for the substrate 100 to thereby obtain the substrate 100 having a substantially level upper surface. In other embodiments, the buffer layer 105 is not be provided on the substrate 100 depending on surface conditions of the substrate 100, ingredients in the substrate 100, etc.

The buffer layer 105 may prevent diffusion of metal atoms, metal ions and/or impurities from the substrate 100. Additionally, the buffer layer 105 may serve to obtain a substantially uniform semiconductor layer pattern 110 by control a heat transfer rate in a successive crystallization process for forming the semiconductor layer pattern 110. Furthermore, the buffer layer 105 may improve a flatness of the substrate 100 in case that the substrate 100 has a relatively irregular surface.

In embodiments, the buffer layer 105 may be formed using a silicon compound. For example, the buffer layer 105 may include silicon oxide (SiOx), silicon nitride (SiNx), silicon oxynitride (SiOxNy), silicon oxycarbide (SiOxCy), silicon carbon nitride (SiCxNy), etc. These may be used alone or in a combination thereof. The buffer layer 105 may be formed by a spin coating process, a chemical vapor deposition (CVD) process, a plasma enhanced chemical vapor deposition (PECVD) process, a high density plasma-chemical vapor deposition (HDP-CVD) process, a printing process, etc. The buffer layer 105 may have a single layer structure or a multi layer structure, which may include a silicon oxide film, a silicon nitride film, a silicon oxynitride film, a silicon oxycarbide film and/or a silicon carbon nitride film.

The semiconductor layer pattern 110 may be formed on the buffer layer 105. In embodiments, a semiconductor layer (not illustrated) may be formed on the buffer layer 105, and then the semiconductor layer may be patterned to form a preliminary semiconductor layer pattern (not illustrated) on the buffer layer 105. The preliminary semiconductor layer pattern may be treated by the crystallization process, so that the semiconductor layer pattern 110 may be formed on the buffer layer 105. The semiconductor layer may be formed by a chemical vapor deposition process, a plasma enhanced chemical vapor deposition process, a low pressure chemical vapor deposition (LPCVD) process, a sputtering process, etc. When the semiconductor layer includes amorphous silicon, the semiconductor layer pattern 110 may include polysilicon. The crystallization process for forming the semiconductor layer pattern 110 may include a laser irradiation process, a thermal treatment process, a thermal process using a catalyst, etc.

In some embodiments, a dehydrogenation process may be performed about the semiconductor layer and/or the preliminary semiconductor layer pattern after forming the semiconductor layer and/or after forming the preliminary semiconductor layer. With the dehydrogenation process, the content of hydrogen atoms in the semiconductor layer or the preliminary semiconductor layer, so that the semiconductor layer pattern 100 may have enhanced electrical characteristics.

Figure 2:
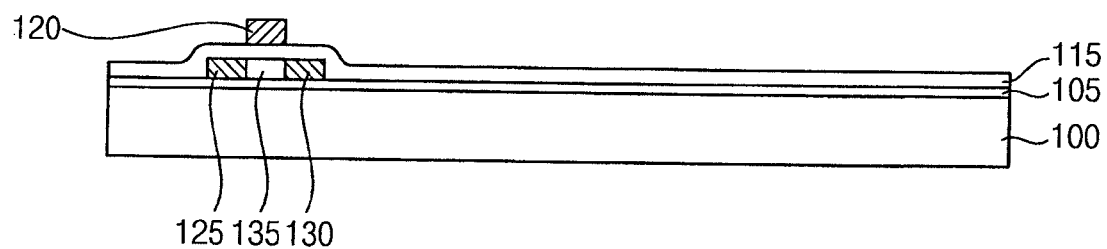

Referring to FIG. 2, a gate insulation layer 115 may be formed on the buffer layer 105 to cover the semiconductor layer pattern 110. The gate insulation layer 115 may be formed by a spin coating process, a chemical vapor deposition process, a plasma enhanced chemical vapor deposition process, a sputtering process, a vacuum evaporation process, a high density plasma-chemical vapor deposition process, a printing process, etc. The gate insulation layer 115 may be formed using silicon oxide, metal oxide, etc. Examples of the metal oxide in the gate insulation layer 115 may include hafnium oxide (HfOx), aluminum oxide (AlOx), zirconium oxide (ZrOx), titanium oxide (TiOx), tantalum oxide (TaOx), etc. These may be used alone or in a combination thereof.

In embodiments, the gate insulation layer 115 may be conformingly formed on the buffer layer 105 along a profile of the semiconductor layer pattern 110, so that a thickness of the gate insulation layer 115 may be substantially uniform. In this case, the gate insulation layer 115 may have a relatively small thickness, and the gate insulation layer 115 may have stepped portions generated adjacent to the semiconductor layer pattern 110. In some embodiments, the gate insulation layer 115 may have a substantially level upper surface while sufficiently covering the semiconductor layer pattern 110. Here, the gate insulation layer 115 may have a relatively large thickness.

A gate electrode 120 may be formed on the gate insulation layer 115. The gate electrode 120 may be located on a portion of the gate insulation layer 115 under which the semiconductor layer pattern 110. That is, the gate electrode 120 may be positioned directly over the semiconductor layer pattern 110. In embodiments, a first conductive layer (not illustrated) may be formed on the gate insulation layer 115, and the first conductive layer may be patterned by a photolithography process or an etching process using an additional etching mask. Thus, the gate electrode 120 may be provided on the gate insulation layer 115. The first conductive layer may be formed by a printing process, a sputtering process, a chemical vapor deposition process, a pulsed laser deposition (PLD) process, a vacuum evaporation process, an atomic layer deposition (ALD) process, etc.

The gate electrode 120 may include metal, alloy, metal nitride, conductive metal oxide, a transparent conductive material, etc. For example, the gate electrode 120 may be formed using aluminum (Al), aluminum alloy, aluminum nitride (AlNx), silver (Ag), silver alloy, tungsten (W), tungsten nitride (WNx), copper (Cu), copper alloy, nickel (Ni), chrome (Cr), chrome nitride (CrNx), molybdenum (Mo), molybdenum alloy, titanium (Ti), titanium nitride (TiNx), platinum (Pt), titanium alloy, tantalum (Ta), tantalum nitride (TaNx), neodymium (Nd), neodymium alloy, scandium (Sc), scandium alloy, strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These may be used alone or in a combination thereof. The gate electrode 120 may have a single layer structure or a multi layer structure, which may include a metal film, an alloy film, a metal nitride film, a conductive metal oxide film and/or a transparent conductive material film.

Although it is not illustrated in FIG. 2, a gate line may be formed on the gate insulation layer 115 while forming the gate electrode 120 on the gate insulation layer 115. The gate line may be coupled to the gate electrode 120, and the gate line may be extended on the gate insulation layer 120 along a first direction.

Using the gate electrode 120 as a mask, impurities may be implanted into portions of the semiconductor layer pattern 110, such that a source region 125 and a drain region 130 may be formed in the semiconductor layer pattern 110. The source and the drain regions 125 and 130 may be properly formed by adjusting an applied energy of an ion implantation process for doping the impurities into both of side portions of the semiconductor layer pattern 110. In this case, a central portion of the semiconductor layer pattern 110 may define a channel region 135 between the source and the drain regions 125 and 130 because the impurities is not doped into the central portion of the semiconductor layer pattern 110. That is, the channel region 135 of the semiconductor layer pattern 110 may be defined by the formation of the source and the drain regions 125 and 130. In some embodiments, a mask (not illustrated) partially exposing the gate insulation layer 115 may be formed on the gate insulation layer 115 adjacent to the gate electrode 120, and then impurities may be implanted into portions of the semiconductor layer pattern 110 using the gate electrode 120 and the mask as implantation masks, thereby forming the source and the drain regions 125 and 130.

In embodiments, the gate electrode 120 may have a width substantially smaller than a width of the semiconductor layer pattern 110. For example, the width of the gate electrode 120 may be substantially the same as or substantially similar to that of the channel region 135 of the semiconductor layer pattern 110. However, the dimensions of the gate electrode 120 and/or the dimensions of the channel region 135 may vary, depending on desired electrical characteristics of a switching device employed in the organic light emitting display device.

Figure 3:
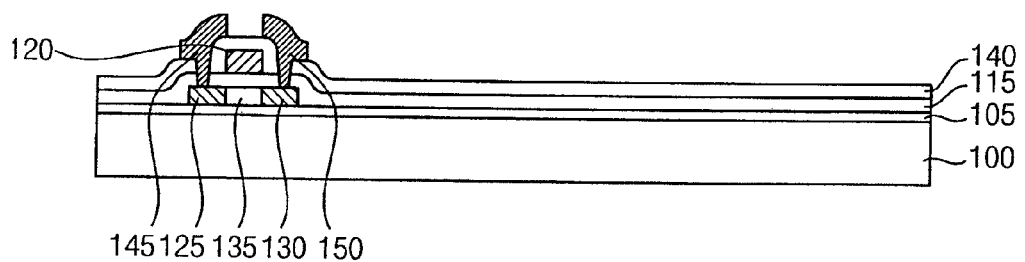

Referring to FIG. 3, a first insulation layer 140 may be formed on the gate insulation layer 115 to cover the gate electrode 120. The first insulation layer 140 may be conformingly formed on the gate insulation layer 115 along a profile of the gate electrode 120, so that a thickness of the first insulation layer 140 may be substantially uniform. Hence, the first insulation layer 140 may have stepped portions adjacent to the gate electrode 120. The first insulation layer 140 may include a silicon compound. For example, the first insulation layer 140 may be formed using silicon oxide, silicon nitride, silicon oxynitride, silicon carbon nitride, silicon oxycarbide, etc. These may be used alone or in a combination thereof. Further, the first insulation layer 140 may have a single layer structure or a multi layer structure, which may include a silicon oxide film, a silicon nitride film, a silicon oxynitride film, a silicon carbon nitride film and/or a silicon oxycarbide film. The first insulation layer 140 may be formed by a spin coating process, a chemical vapor deposition process, a plasma enhanced chemical vapor deposition process, a high density plasma-chemical vapor deposition process, etc. The first insulation layer 140 may electrically insulate the gate electrode 120 from a source electrode 145 and a drain electrode 150 successively formed.

The source and the drain electrodes 145 and 150 may be provided on the first insulation layer 140. The source and the drain electrodes 145 and 150 may be separated from each other by a predetermined distance. The source and the drain electrodes 145 and 150 may be adjacent to the gate electrode 120. For example, the source and the drain electrodes 145 and 150 may respectively extend from portions of the first insulation layer 140 positioned over the source and the drain regions 125 and 130 to portions of the first insulation layer 140 located on the gate electrode 120. Additionally, the source and the drain electrodes 145 and 150 may pass through the first insulation layer 140 and may make contact with the source and the drain regions 125 and 130, respectively.

In embodiments, the first insulation layer 140 may be partially etched to form holes partially exposing the source and the drain regions 125 and 130, and then a second conductive layer (not illustrated) may be formed on the first insulation layer 140 to fill the holes. The second conductive layer may be patterned to obtain the source and the drain electrode 145 and 150 as illustrated in FIG. 3. The second conductive layer may be formed by a sputtering process, a chemical vapor deposition process, a pulsed laser deposition process, a vacuum evaporation process, an atomic layer deposition process, a printing process, etc. Each of the source and the drain electrodes 145 and 150 may include metal, alloy, metal nitride, conductive metal oxide, a transparent conductive material, etc. For example, each of the source and the drain electrodes 145 and 150 may be formed using aluminum, aluminum alloy, aluminum nitride, silver, silver alloy, tungsten, tungsten nitride, copper, copper alloy, nickel, nickel alloy, chrome, chrome nitride, molybdenum, molybdenum alloy, titanium, titanium alloy, titanium nitride, platinum, platinum alloy, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. Each of the source and the drain electrode 145 and 150 may have a single layer structure or a multi layer structure, which may include a metal film pattern, an alloy film pattern, a metal nitride film pattern, a conductive metal oxide film pattern and/or a transparent conductive material film pattern.

Although it is not illustrated in FIG. 3, a data line may be formed on the first insulation layer 140 while forming the source and the drain electrodes 145 and 150 on the source and the drain regions 125 and 130. The data line may extend on the first insulation layer 140 along a second direction. Here, the second direction may be substantially perpendicular to the first direction where the gate line may extend. The data line may make contact with the source electrode 145.

When the source and the drain electrodes 145 and 150 are formed on the first insulation layer 140, the switching device of the organic light emitting display device may be provided on the substrate 100. The switching device may include the semiconductor layer pattern 110, the gate insulation layer 115, the gate electrode 120, the source electrode 145 and the drain electrode 150.

Figure 4:
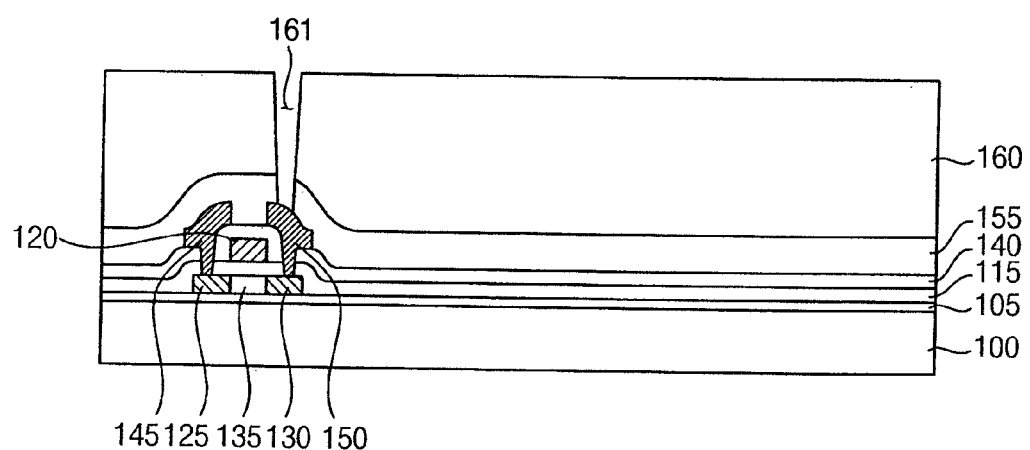

Referring to FIG. 4, a protection layer 155 may be formed on the first insulation layer 140 to cover the source and the drain electrodes 145 and 150. The protection layer 155 may have a thickness sufficiently covering the source and the drain electrodes 145 and 150. The protection layer 155 may include an organic material or an inorganic material. For example, the protection layer 155 may be formed using photoresist, acryl-based resin, polyimide-based resin, polyamide-based resin, siloxane-based resin, resin containing photosensitive carboxyl group, novolak resin, alkali-developable resin, silicon oxide, silicon nitride, silicon oxynitride, silicon oxycarbide, silicon carbon nitride, aluminum, magnesium, zinc, hafnium, titanium, tantalum, aluminum oxide, titanium oxide, tantalum oxide, magnesium oxide, zinc oxide, hafnium oxide, zirconium oxide, etc. These may be used alone or in a combination thereof. The protection layer 155 may be formed by a spin coating process, a printing process, a sputtering process, a chemical vapor deposition process, an atomic layer deposition process, a plasma enhanced chemical vapor deposition process, a high density plasma-chemical vapor deposition process, a vacuum evaporation process, etc.

In some embodiments, the protection layer 155 covering the switching device does not need to be formed on the first insulation layer 140, depending on ingredients, dimensions and/or structures of a second insulation layer 160 successively formed.

The second insulation layer 160 may be formed on the protection layer 155. The second insulation layer 160 may have a single layer structure or a multi layer structure including at least two insulation films. In embodiments, a planarization process may be executed about the second insulation layer 160 to improve a flatness of the second insulation layer 160. For example, the second insulation layer 160 may have a substantially level surface by a chemical vapor deposition process and/or an etch back process. The second insulation layer 160 may include an organic material. For example, the second insulation layer 160 may be formed using photoresist, acryl-based resin, polyimide-based resin, polyamide-based resin, siloxane-based resin, resin containing photosensitive carboxyl group, novolak resin, alkali-developable resin,. These may be used alone or in a combination thereof. In some embodiments, the second insulation layer 160 may be formed using an inorganic material such as a silicon compound, metal, metal oxide, etc. For example, the second insulation layer 160 may include silicon oxide, silicon nitride, silicon oxynitride, silicon oxycarbide, silicon carbon nitride, aluminum, magnesium, zinc, hafnium, titanium, tantalum, aluminum oxide, titanium oxide, tantalum oxide, magnesium oxide, zinc oxide, hafnium oxide, zirconium oxide, etc. These may be used alone or in a combination thereof. The second insulation layer 160 may be formed on the protection layer 155 by a spin coating process, a printing process, a sputtering process, a chemical vapor deposition process, an atomic layer deposition process, a plasma enhanced chemical vapor deposition process, a high density plasma-chemical vapor deposition process, a vacuum evaporation process, etc.

The second insulation layer 160 and the protection layer 155 may be partially etched by a photolithography process or an etching process using an additional etching mask, so that a contact hole 161 partially exposing the drain electrode 150 may be formed through the second insulation layer 160 and the protection layer 155. In embodiments, the contact hole 161 may have a sidewall inclined by a predetermined angle. For example, the contact hole 161 may have an upper width substantially larger than a lower width thereof.

Figure 5:
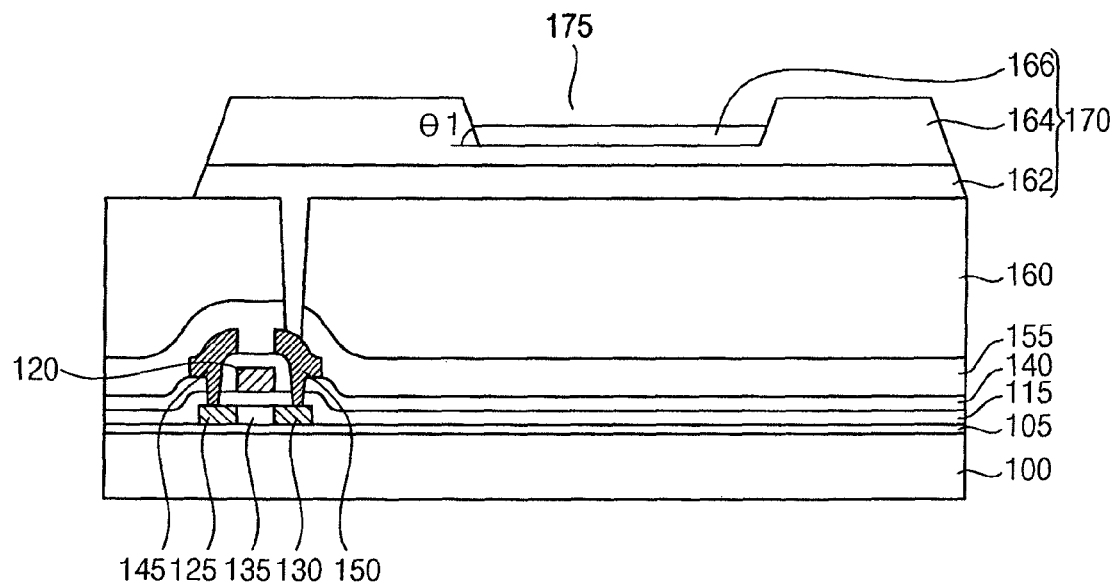

Referring to FIG. 5, a first electrode layer (not illustrated) may be formed on the second insulation layer 160 to fill the contact hole 161. The first electrode layer may have a multi layer structure. In embodiments, the first electrode layer may make contact with the exposed drain electrode 150 by the contact hole 161 because the first electrode layer may fill the contact hole 161. In some embodiments, a contact, a plug or a pad may be formed on the drain electrode 150 to fill the contact hole 161, and then the first electrode layer may be formed on the second insulation layer 160 and the contact, the plug or the pad. Here, the first electrode layer may be electrically coupled to the drain electrode 150 through the contact, the plug or the pad.

When the organic light emitting display device has a top emission type, the first electrode layer may include a first electrode film, a second electrode film and a third electrode film. In this case, the first electrode film may fill the contact hole 161 and may extend on the second insulation layer 160. The second and the third electrode films may be sequentially formed on the first electrode film.

The first electrode film of the first electrode layer may be formed using a first transparent conductive material. For example, the first electrode film may include indium tin oxide, indium zinc oxide, zinc oxide, gallium oxide, zinc tin oxide, etc. These may be used alone or in a combination thereof. The first electrode film may be formed by a sputtering process, a chemical vapor deposition process, an atomic layer deposition process, a pulsed laser deposition process, a printing process, etc.

The second electrode film of the first electrode layer may be formed using a reflective metal, alloy having a reflectivity, etc. For example, the second electrode film may include aluminum, silver, platinum, gold (Au), chrome, tungsten, molybdenum, titanium, palladium (Pa), iridium (Ir), alloy thereof, etc. Additionally, the second electrode film may be formed by a printing process, a sputtering process, a chemical vapor deposition process, an atomic layer deposition process, a pulsed laser deposition process, etc.

The third electrode film of the first electrode layer may include a second transparent conductive material. For example, the third electrode film may be formed using indium tin oxide, tin oxide, indium zinc oxide, zinc oxide, zinc tin oxide, gallium oxide, etc. The third electrode film may be formed by a sputtering process, sputtering process, a chemical vapor deposition process, an atomic layer deposition process, a pulsed laser deposition process, a printing process, etc.

In embodiments, the first transparent material in the first electrode film may be substantially the same as or substantially similar to the second transparent conductive material in the third electrode film. In some embodiments, the first transparent conductive material may be different from the second transparent conductive material. That is, the first electrode film may include a material substantially different from that of the third electrode film.

When the first electrode layer includes the first to the third electrode films, the first electrode film may be formed on the second insulation layer 160 to sufficiently fill the contact hole 161, and then the second electrode film may be formed on the first electrode film. For example, the first electrode film may have a first thickness of about 500 Å to about 1,000 Å based on an upper face of the second insulation layer 160, and the second electrode film may have a second thickness of about 2,000 Å to about 4,000 Å measured from an upper face of the first electrode film. Therefore, a ratio between the first thickness and the second thickness may be in a range of about 1.0:2.0 to about 1.0:8.0. The first and the second electrode films may be patterned to provide a first electrode film pattern 162 and a second electrode film pattern 164 on the second insulation layer 160. In this case, the first electrode film pattern 162 may be connected to the drain electrode 150, and a recess structure 175 having a predetermined depth may be formed on the second electrode film pattern 164.

In embodiments, the depth of the recess structure 175 may be substantially smaller than the second thickness of the second electrode film pattern 164. Thus, the first electrode film pattern 162 is not exposed when the recess structure 175 is formed on the second electrode film pattern 164. For example, the depth of the recess structure 175 may be in a range of about 1,000 Å to about 2,000 Å based on an upper face of the second electrode film pattern 164. Therefore, a ratio between the depth of the recess structure 175 and the second thickness of the second electrode film pattern 164 may be in a range of about 1.0:1.0 to about 1.0:4.0.

In embodiments, the recess structure 175 may be formed together with the second electrode film pattern 164. For example, the first electrode film pattern 162, the second electrode film pattern 164 and the recess structure 175 may be formed together at the same time during etching process by using a halftone mask or a halftone slit mask. In some embodiments, the first electrode film pattern 162 and the second electrode film pattern 164 may be formed on the second insulation layer 160, and then the recess structure 175 may be provided on the second electrode film pattern by an additional etching process. For example, a photoresist pattern (not illustrated) may be formed on the second electrode film pattern 164, and the second electrode film pattern 164 may be partially etched by a dry etching process such as an oxygen plasma etching process while controlling etching conditions of the dry etching process.

After the third electrode film may be formed on the second electrode film pattern 164 having the recess structure 175 and the second insulation layer 160, the third electrode film may be patterned to form the third electrode film pattern 166 in the recess structure 175 of the second electrode film pattern 164. The third electrode film pattern 166 may have a relatively small third thickness. Therefore, a first electrode 170 having the first to the third electrode film patterns 162, 164 and 166 and the recess structure 175 may be provided on the second insulation layer 160. In embodiments, the first electrode 170 may include the recess structure 175 as a reflection structure for reflecting a light generated from an organic light emitting structure 185 successively formed thereon. For example, the first electrode 170 may serve as an anode of the organic light emitting display device. The third thickness of the third electrode film pattern 164 may be in a range of about 1,000 Å to about 2,000 Å measured from a bottom face of the recess structure 175. Thus, a ratio between the third thickness of the third electrode film pattern 166 and the second thickness of the second electrode film pattern 164 may be in a range of about 1.0:2.0 to about 1.0:8.0. Further, a ratio between the depth of the recess structure 175 and the third thickness of the third electrode film pattern 166 may be in a range of about 1.0:0.25 to about 1.0:1.0.

In embodiments, the third electrode film pattern 166 may be confined by the recess structure 175 of the second electrode film pattern 164. For example, a lower face of the third electrode film pattern 166 may contact with the bottom face of the recess structure 175, and a sidewall of the third electrode film pattern 166 make contact a sidewall of the recess structure 175. The sidewall of the recess structure 175 of the first electrode 170 may have a first angle of inclination θ1 relative to a plane and/or a direction substantially parallel to the substrate 100. For example, the first angle of inclination θ1 of the recess structure 175 may be in a range of about 10° to about 70° with respect to a plane and/or an axis substantially parallel to an upper face of the substrate 100. Hence, the sidewall of the third electrode film pattern 166 may have an angle of inclination of about 10° to about 70° relative to the plane and/or the axis substantially parallel to the substrate 100. When the first electrode 170 includes the recess structure 175 as the reflection structure, the organic light emitting display device may have the top emission type.

Figure 6:
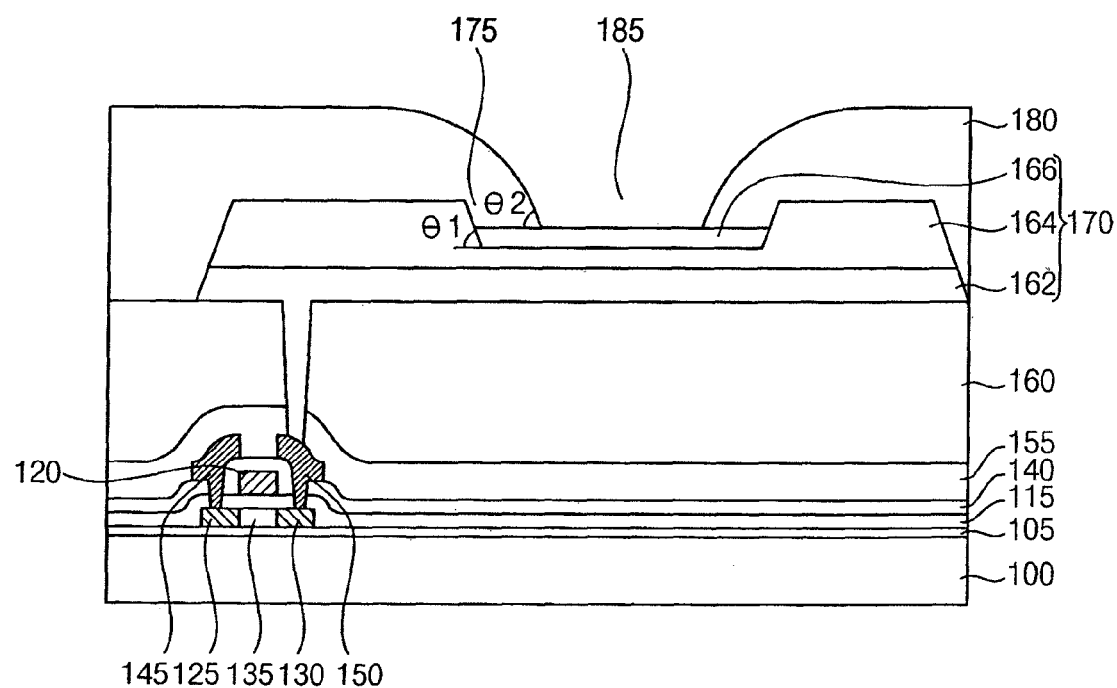

Referring to FIG. 6, a pixel defining layer 180 may be formed on the first electrode 170 and the second insulation layer 160. The pixel defining layer 180 may include an organic material or an inorganic material. For example, the pixel defining layer 180 may be formed using photoresist, polyacryl-based resin, polyimide-based resin, acryl-based resin, a silicon compound, etc. These may be used alone or in a mixture thereof. Additionally, the pixel defining layer 180 may be formed by way of a spin coating process, a spray process, a printing process, a chemical vapor deposition process, etc.

The pixel defining layer 180 may be partially etched to form an opening 185 that partially exposes the first electrode 170. For example, the opening 185 of the pixel defining layer 180 may entirely or partially expose the third electrode film pattern 166 of the first electrode 170. The opening 185 of the pixel defining layer 180 may define a luminescent region and a nonluminescent region of the organic light emitting display device. That is, a portion of the organic light emitting display device including the opening 185 may define the luminescent region, and another portion of the organic light emitting display device neighboring the opening 185 may define the nonluminescent region. As described above, the first electrode 170 includes the second electrode film pattern 164 and the recess structure 175, so that the first electrode 170 may reflect the light generated from the organic light emitting structure 190 and headed to the nonluminescent region toward the luminescent region. That is, the recess structure 175 of the first electrode 170 may reflect the light moving to the nonluminescent region toward the luminescent region. Therefore, the organic light emitting display device may ensure a considerably increased light efficiency, and also an image displayed by the organic light emitting display device may have a greatly enhanced brightness.

In embodiments, a sidewall of the opening 185 of the pixel defining layer 180 may be adjacent to the sidewall of the recess structure 175 of the first electrode 170, such that a lower sidewall of the opening 185 may have a second angle of inclination θ2. In this case, the second angle of inclination θ2 of the opening 195 may be substantially larger than the first angle of inclination θ1 of the recess structure 175. For example, the lower sidewall of the opening 185 may have the second angle of inclination θ2 in a range of about 20° to about 80° with respect to the plane and/or the direction substantially parallel to the substrate 100. Therefore, a ratio between the first angle of inclination θ1 of the recess structure 175 and the second angle of inclination θ2 of the opening 185 may be in a range of about 0.3:1.0 to about 1.0:4.0. Further, an upper sidewall of the opening 185 may have a rounded shape. Thus, the light emitting structure 190 including organic layers and a second electrode 195 (see FIG. 7) may be uniformly formed on the pixel defining layer 180 and the first electrode 170.

In embodiments, the pixel defining layer 180 in the luminescent region may have a thickness substantially smaller than a thickness of the first electrode 170. For example, a ratio of the thickness of the pixel defining layer 180 in the luminescent region and the thickness of the first electrode 170 may be below about 1.0. Additionally, the sidewall of the opening 185 may be spaced apart from the sidewall of the recess structure 170 by interposing the pixel defining layer 180 therebetween. For example, the sidewall of the opening 185 may be separated from the sidewall of the recess structure 170 by a distance above about 3.0 μm. As the lower sidewall of the opening 185 has the second angle of inclination θ2, the opening 185 of the pixel defining layer 180 may have an upper width substantially larger than a lower width thereof. Hence, an exposed portion of the third electrode film pattern 166 may have an area substantially smaller than a total area of the third electrode film pattern 166. Here, a ratio between an angle of inclination of the opening 185 and an angle of inclination of the recess structure 175 may be below about ½. That is, a ratio of the angle of inclination θ2 relative to the first angle of inclination θ1 may be above about 2.0.

Figure 7:
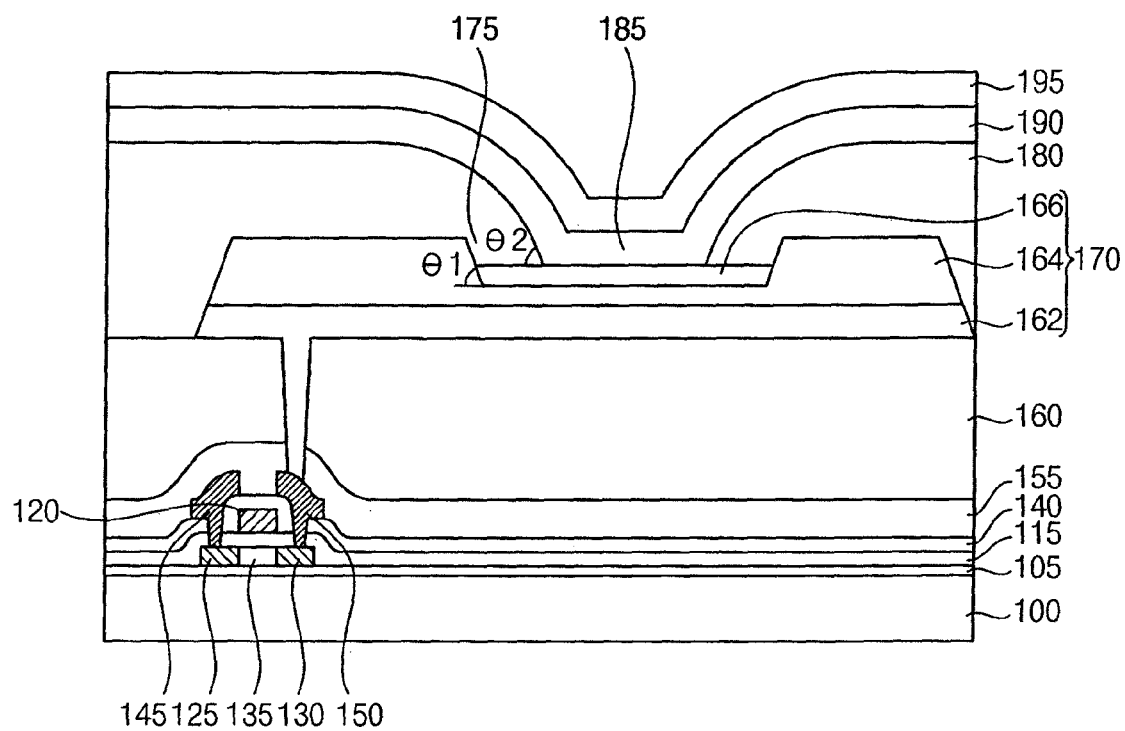

Referring to FIG. 7, the light emitting structure 190 may be formed on the pixel defining layer 180 and the exposed first electrode 170. In embodiments, the light emitting structure 190 may have a multi layer structure that may include an organic light emitting layer (EL), a hole injection layer (HIL), a hole transfer layer (HTL), an electron transfer layer (ETL), an electron injection layer (EIL), etc. The organic light emitting layer of the light emitting structure 190 may be formed using luminescent materials for generating a red color of light, a green color of light or a blue color of light for various pixels of the organic light emitting display device. In some embodiments, the organic light emitting layer of the light emitting structure 190 may have a multi layer structure that may include substantially a plurality of stacked luminescent materials for generating a while color of light by mixing a red color of light, a green color of light and a blue color of light. The opening 185 of the pixel defining layer 180 has the substantially rounded upper sidewall as described above, the light emitting structure 190 may be conformingly formed on the first electrode 170 and the pixel defining layer 180, so that a thickness of the light emitting structure 190 may be uniform. Further, a portion of the light emitting structure 190 in the luminescent region may have a predetermined angle of inclination with respect to the second insulation layer 160, depending on the second angle of inclination θ2 of the opening 185. For example, a portion of the light emitting structure 190 contacting the sidewall of opening 185 may have an angle of inclination in a range of about 20° to about 80° relative to the plane and/or the axis substantially parallel to the substrate 100.

The second electrode 195 may be formed on the light emitting structure 190. The second electrode 195 may also be uniformly formed on the light emitting structure 190 in conformation with the shape of the opening 185 of the pixel defining layer 180. The second electrode 195 may serve a cathode of the organic light emitting display device. The second electrode 195 located in the luminescent region may have an angle of inclination as the second angle of inclination θ2 of the opening 185.

When the organic light emitting display device has the top emission type, the second electrode 195 may include a third transparent conductive material. For example, the second electrode 195 may be formed using indium tin oxide, tin oxide, indium zinc oxide, zinc oxide, zinc tin oxide, gallium oxide, etc. These may be used alone or in a combination thereof. Additionally, the second electrode 195 may be formed by way of a sputtering process, a chemical vapor deposition process, an atomic layer deposition process, a pulsed laser deposition process, a vacuum evaporation process, a printing process, etc.

In embodiments, the third transparent conductive material of the second electrode 195 may be substantially the same as or substantially similar to the first transparent conductive material of the first electrode film pattern 162 of the first electrode 170 and/or the second transparent conductive material of the third electrode film pattern 166. Alternatively, the third transparent conductive material of the second electrode 195 may be substantially different from the first transparent conductive material of the first electrode film pattern 162 and/or the second transparent conductive material of the third electrode film pattern 166.

According to embodiments, an organic light emitting display device may include a first electrode having a recess structure as a reflection structure, and the organic light emitting display device may ensure an enhanced light by properly adjusting a ratio between an angle of inclination of the recess structure and an angle of inclination of an opening of a pixel defining layer and/or a ratio between a thickness of the pixel defining layer and a thickness of the first electrode in a luminescent of the organic light emitting display device. In case that an electrode without a recess structure has a light reflection efficiency of about 100%, the first electrode including the recess structure may have a light reflection efficiency of about 135% when a ratio between the angle of inclination of the opening of the pixel defining layer and the angle of inclination of the recess structure is about 1.32 and a ratio between the thickness of the first electrode and the thickness of the pixel defining layer in the luminescent region is about 3.0. When a ratio between the angle of inclination of the opening of the pixel defining layer and the angle of inclination of the recess structure is about 1.32 and a ratio between the thickness of the first electrode and the thickness of the pixel defining layer in the luminescent region is about 19.0, the first electrode may have a light reflection efficiency of about 143.7%. In case that a ratio between the angle of inclination of the opening of the pixel defining layer and the angle of inclination of the recess structure is about 1.41 and a ratio between the thickness of the first electrode and the thickness of the pixel defining layer in the luminescent region is about 3.0, the first electrode may have a light reflection efficiency of about 106.8%. When a ratio between the angle of inclination of the opening of the pixel defining layer and the angle of inclination of the recess structure is about 1.05 and a ratio between the thickness of the first electrode and the thickness of the pixel defining layer in the luminescent region is about 4.0, the first electrode may have a light reflection efficiency of about 130.8%. Further, the first electrode may have a light reflection efficiency varying, depending on a distance between a sidewall of the recess structure and a sidewall of the opening. For example, the distance between the sidewall of the recess structure and the sidewall of the opening may be properly ensured in order to improve the light reflection efficiency of the first electrode.

FIGS. 8 to 12 are cross-sectional views illustrating a method of manufacturing an organic light emitting display device in accordance with embodiments. The method illustrated in FIGS. 8 to 12 may provide an organic light emitting display device having a construction substantially the same as or substantially similar to that of the organic light emitting display device described with reference to FIG. 7 except a first electrode, a pixel defining layer, a light emitting structure and a second electrode. However, the method illustrated in FIGS. 8 to 12 may be easily modified to produce organic light emitting display devices having various constructions.

Figure 8:
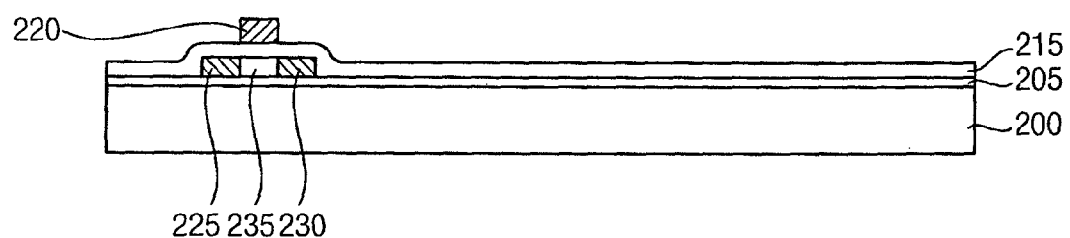
FIGS. 8 to 12 are cross-sectional views illustrating a method of manufacturing an organic light emitting display device in accordance with some embodiments.

Referring to FIG. 8, a buffer layer 205 may be formed on a substrate 200. The substrate 200 may include a transparent insulation substrate. For example, the substrate 200 may include a glass substrate, a quartz substrate, a transparent resin substrate, etc. Examples of the transparent resin substrate used as the substrate 200 may include polyimide-based resin, acryl-based resin, polyacrylate-based resin, polycarbonate-based resin, polyeter-based resin, polyethylene-terephthalate-based resin, sulfonic acid-based resin, etc. The buffer layer 205 may be formed using a silicon compound. The buffer layer 205 may have a single layer structure including a silicon compound film, or a multi layer structure including silicon compound films.

In some embodiments, a planarization process may be executed for the substrate 200 before forming of the buffer layer 205, so that the substrate 200 may have a substantially flat surface. For example, the planarization process for the substrate 200 may include a chemical mechanical polishing process and/or an etch back process. In other embodiments, the buffer layer 205 may be omitted according to surface conditions and/or ingredients of the substrate 200.

A semiconductor layer pattern (not illustrated) may be formed on the buffer layer 205. In embodiments, after a semiconductor layer (not illustrated) may be formed on the buffer layer 205 by chemical vapor deposition process, a plasma enhanced chemical vapor deposition process, a low pressure chemical vapor deposition process or a sputtering process, the semiconductor layer may be partially etched to provide a preliminary semiconductor layer pattern (not illustrated) on the buffer layer 205. A crystallization process may be carried out about the preliminary semiconductor layer pattern, and thus the semiconductor layer pattern may be formed on the buffer layer 205.

A gate insulation layer 215 covering the semiconductor layer pattern may be formed on the buffer layer 205. The gate insulation layer 215 may be formed using silicon oxide and/or metal oxide by way of a spin coating process, a chemical vapor deposition process, a plasma enhanced chemical vapor deposition process, a sputtering process, a vacuum evaporation process, a high density plasma-chemical vapor deposition process, a printing process, etc. The gate insulation layer 115 may have a relatively thin thickness and may uniformly be located conformingly on the buffer layer 205 along a profile of the semiconductor layer pattern. In some embodiments, the gate insulation layer 215 may have a relatively large thickness for ensuring a substantially level surface.

Referring now to FIG. 8, a gate electrode 220 may be formed on the gate insulation layer 215. The gate electrode 220 may be located over the semiconductor layer pattern. In embodiments, a first conductive layer (not illustrated) may be formed on the gate insulation layer 215 using metal, alloy, metal nitride, conductive metal oxide and/or transparent conductive material. The first conductive layer may be partially etched to form the gate electrode 220 on the gate insulation layer 215. The first conductive layer may be formed by a printing process, a sputtering process, a chemical vapor deposition process, a pulsed laser deposition process, a vacuum evaporation process, an atomic layer deposition process, etc. The gate electrode 220 may have a single layer structure or a multi layer structure. Additionally, a gate line (not illustrated) contacting the gate electrode 220 may be formed on the gate insulation layer 215 in forming of the gate electrode 220 on the gate insulation layer 215.

Impurities may be doped into side portions of the semiconductor layer pattern to thereby obtain an active pattern including a source region 225, a drain region 230 and a channel region 235. Here, the gate electrode 220 may serve as an implantation mask for implanting the impurities into the side portions of the semiconductor layer pattern. The gate electrode 220 may have a width substantially smaller than a width of the active pattern, however, dimensions of the gate electrode 220 and/or dimensions of the channel region 235 may vary, depending on desired electrical characteristics of a switching device provided on the substrate 200.

Figure 9:
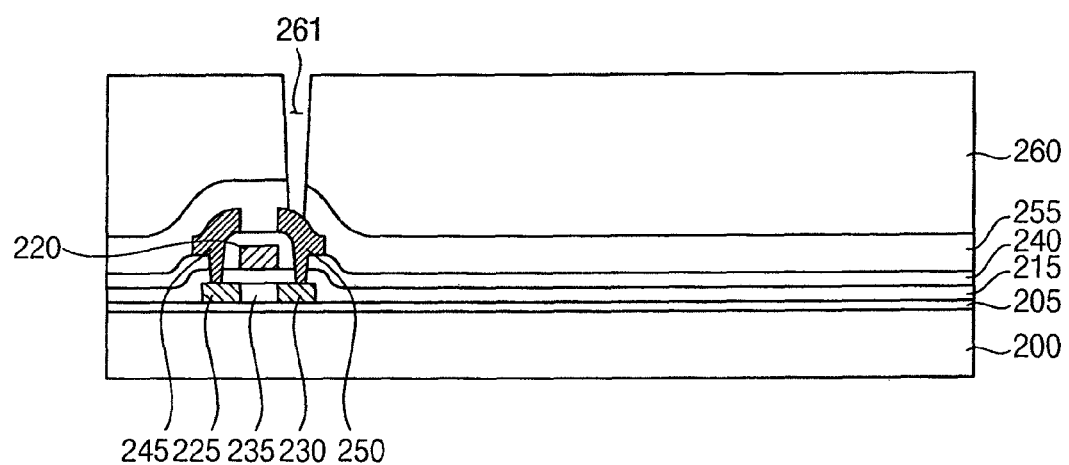

Referring to FIG. 9, a first insulation layer 240 covering the gate electrode 220 may be formed on the gate insulation layer 215. The first insulation layer 240 may be uniformly formed on the gate insulation layer 215 along a profile of the gate electrode 220, so that the first insulation layer 240 may include stepped portions generated adjacent to the gate electrode 220. The first insulation layer 240 may be formed using a silicon compound by way of a spin coating process, a chemical vapor deposition process, a plasma enhanced chemical vapor deposition process, a high density plasma-chemical vapor deposition process, etc. The first insulation layer 240 may have a single layer structure including one of a silicon oxide film, a silicon nitride film, a silicon oxynitride film, a silicon carbon nitride film and a silicon oxycarbide film. Alternatively, the first insulation layer 240 may have a multi layer structure including at least two of a silicon oxide film, a silicon nitride film, a silicon oxynitride film, a silicon carbon nitride film and a silicon oxycarbide film.

A source electrode 245 and a drain electrode 250 may be formed on the first insulation layer 240. The source and the drain electrodes 245 and 250 may be spaced apart from each other by a predetermined distance. The source and the drain electrodes 245 may pass through the first insulation layer 240 and may make contact with the source and the drain regions 225 and 230, respectively. In embodiments, the first insulation layer 240 may be partially etched to form holes (not illustrated) that partially expose the source and the drain regions 225 and 230. After a second conductive layer (not illustrated) may be formed on the first insulation layer 140 using metal, alloy, metal nitride, conductive metal oxide and/or a transparent conductive material to fully fill the holes, the second conductive layer may be partially etched to provide the source and the drain electrode 245 and 250. Here, the second conductive layer may be formed by way of a sputtering process, a chemical vapor deposition process, a pulsed laser deposition process, a vacuum evaporation process, an atomic layer deposition process, a printing process, etc. Each of the source and the drain electrode 245 and 250 may have a single layer structure including one of a metal film pattern, an alloy film pattern, a metal nitride film pattern, a conductive metal oxide film pattern and a transparent conductive material film pattern. Alternatively, each of the source and the drain electrode 245 and 250 may have a multi layer structure including more than two of a metal film pattern, an alloy film pattern, a metal nitride film pattern, a conductive metal oxide film pattern and a transparent conductive material film pattern. A data line (not illustrated) contacting the source electrode 245 may be formed on the first insulation layer 240 in forming the source and the drain electrodes 245 and 250.

A protection layer 255 covering the source and the drain electrodes 245 and 250 may be formed on the first insulation layer 240. The protection layer 255 may have a relatively large thickness for completely covering the source and the drain electrodes 245 and 250. The protection layer 255 may include an organic material or an inorganic material. For example, the protection layer 255 may be formed using an organic material or an inorganic material by way of a spin coating process, a printing process, a sputtering process, a chemical vapor deposition process, an atomic layer deposition process, a plasma enhanced chemical vapor deposition process, a high density plasma-chemical vapor deposition process, a vacuum evaporation process, etc. In some embodiments, the protection layer 255 covering the switching device may be omitted.

A second insulation layer 260 may be formed on the protection layer 255 using an organic material or an inorganic material by a spin coating process, a printing process, a sputtering process, a chemical vapor deposition process, an atomic layer deposition process, a plasma enhanced chemical vapor deposition process, a high density plasma-chemical vapor deposition process, a vacuum evaporation process, etc. The second insulation layer 260 may have a single layer structure including an organic material film or an inorganic material film. Alternatively, the second insulation layer 260 may have a multi layer structure including organic material films and/or inorganic material films. In some embodiments, a planarization process may be performed about the second insulation layer 260 to ensure a level surface of the second insulation layer 260.

The second insulation layer 260 and the protection layer 255 may be partially etched to form a contact hole 261 that may partially exposes the drain electrode 250. For example, the contact hole 261 may be formed through second insulation layer 260 and the protection layer 255 by way of a dry etching process or a wet etching process depending on the materials included in the second insulation layer 260 and the protection layer 255.

Figure 10:
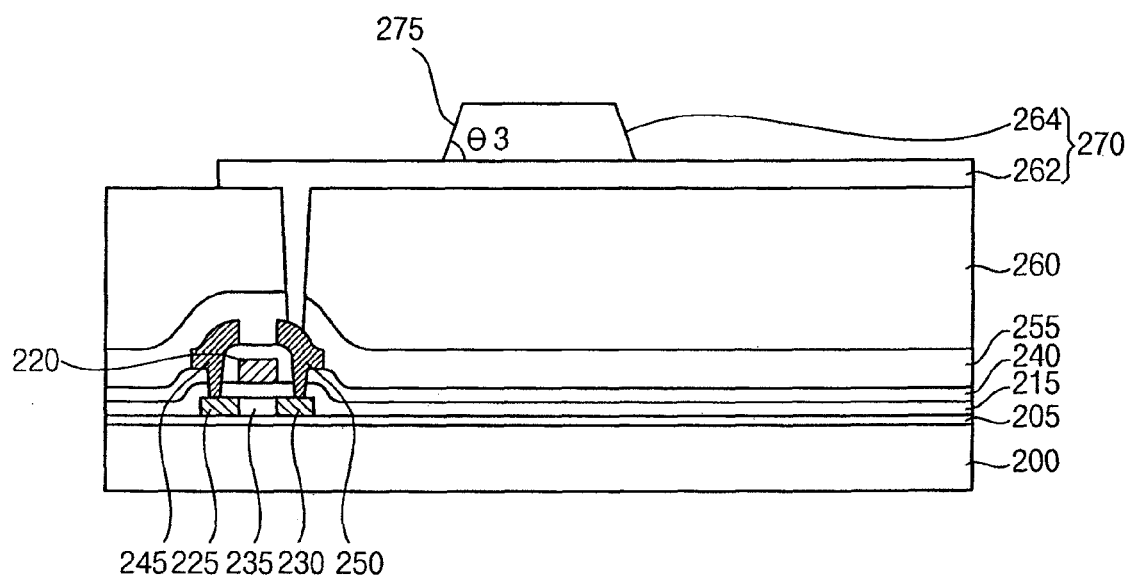

Referring to FIG. 10, a first electrode layer (not illustrated) having a multi layer structure may be formed on the second insulation layer 260 to fill the contact hole 261.

When the organic light emitting display device has a bottom emission type, the first electrode layer may be created by forming a first electrode film and a second electrode film on the second insulation layer 260. The first electrode film may fill the contact hole 261 and may extend on the second insulation layer 260. The second electrode film may be disposed on the first electrode film. For example, the first electrode film may be formed using a transparent conductive material by way of a sputtering process, a chemical vapor deposition process, an atomic layer deposition process, a pulsed laser deposition process, a printing process, etc. Examples of the transparent conductive material in the first electrode film may include indium tin oxide, indium zinc oxide, zinc oxide, gallium oxide, zinc tin oxide, etc. The second electrode film may be formed using a first reflective material such as reflective metal, alloy having a reflectivity, etc. Examples of the first reflective material may include aluminum, silver, platinum, gold, chrome tungsten, molybdenum, titanium, palladium, iridium, alloy thereof, etc. The second electrode film may be formed on the first electrode film by a printing process, a sputtering process, a chemical vapor deposition process, an atomic layer deposition process, a pulsed laser deposition process, etc.

The first electrode layer having the first and the second electrode films may be partially etched to form a first electrode 270 on the second insulation layer 260. The first electrode 270 may include a first electrode film pattern 262 and a second electrode film pattern 264. In embodiments, the first electrode film pattern 262 and the second electrode film pattern 264 may be formed together at the same time during etching process. In some embodiments, the second electrode film may be patterned to form the second electrode film pattern 264 having a protrusion structure or bump structure 275 on the first electrode film, and then the first electrode film may be patterned to form the first electrode film pattern 262 between the second insulation layer 260 and the second electrode film pattern 264. The first and the second electrode film patterns 262 and 264 may be formed by way of a dry etching process or a wet etching process.

In embodiments, the first electrode film pattern 262 of the first electrode 270 may make contact with the drain electrode 250 of the switching device, and may extend on the second insulation layer 260. The second electrode film pattern 264 may include the protrusion structure 275 having an inclined sidewall. In this case, the sidewall of the protrusion structure 275 may have a third angle of inclination (θ3) relative to a plane, a direction or an axis substantially parallel to a surface of the substrate 200. For example, the sidewall of the protrusion structure 275 may have the third angle of inclination (θ3) in a range of about 10° to about 70° with respect to the plane, the direction or the axis substantially parallel to the substrate 200. Therefore, the first electrode 270 may include the protrusion structure 275 as a reflection structure for reflecting a light heading toward a nonluminescent region of the organic light emitting display device.

Figure 11:
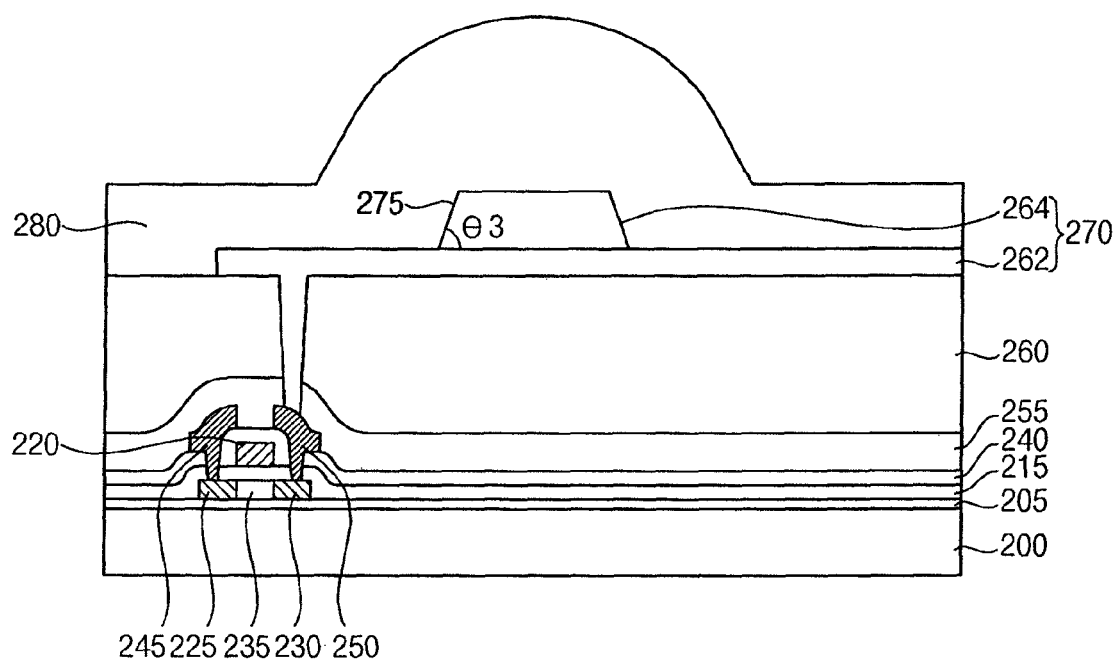

Referring to FIG. 11, a pixel defining layer 280 including an organic material or an inorganic material may be formed on the first electrode 270 and the second insulation layer 260. The pixel defining layer 280 may be formed by way of a spin coating process, a spray process, a printing process, a chemical vapor deposition process, a plasma enhanced chemical vapor deposition process, etc. The pixel defining layer 280 may define the nonluminescent region and a luminescent region of the organic light emitting display device. For example, a protruding portion of the pixel defining layer 280 enclosing or covering the protrusion structure 275 may substantially define the luminescent region whereas a portion of the pixel defining layer 280 which does not cover the protruding portion may substantially define the nonluminescent region.

In embodiments, the protruding portion of the pixel defining layer 280 in the luminescent region may have a substantially rounded shape. For example, the protruding portion of the pixel defining layer 280 may have a substantially semicircular shape, a substantially dome shape, etc. The portion of the pixel defining layer 280 in the luminescent region may be uniformly formed on the first electrode film pattern 262. A light emitting structure 290 and a second electrode 295 (see FIG. 12) may be conformingly formed on the first electrode 270 and the pixel defining layer 280 because the pixel defining layer 280 may have the above-described structure. Therefore, the organic light emitting display device may include pixels having improved uniformity.

In embodiments, the pixel defining layer 280 may have a relatively large thickness, so that the pixel defining layer 280 may sufficiently cover the second electrode film pattern 264 of the first electrode 270. In the luminescent region, a ratio between a width of the protruding portion and a thickness of the protruding portion of the pixel defining layer 280 may be above about 1.0. As described above, the protruding portion of the pixel defining layer 280 may enclose the second electrode film pattern 264 in the luminescent region. In the nonluminescent region, a ratio between a width of the portion of the pixel defining layer 280 and a thickness of the second electrode film pattern 264 may be below about 1.0. Additionally, the portion of the pixel defining layer 280 may be separated from the second electrode film pattern 264 by a distance of above about 3.0 μm. With the pixel defining layer 280 and the first electrode 270 having above-described structures, a light headed to the nonluminescent region may be reflected toward the substrate 200 in the luminescent region after the light is generated from the light emitting structure 290. For example, the light may be generated from the light emitting structure 270, and then some portions of the light may be headed to the substrate 200 in the luminescent region whereas other portions of the light may be headed to the nonluminescent region. In the nonluminescent region, the light may be reflected by the protrusion structure 275 of the first electrode 270 toward the substrate 200 in the luminescent region, and the light may also reflected by the second electrode 295 toward the substrate 200 in the luminescent region. Therefore, the organic light emitting display device may ensure a considerably increased light efficiency.

Figure 12:
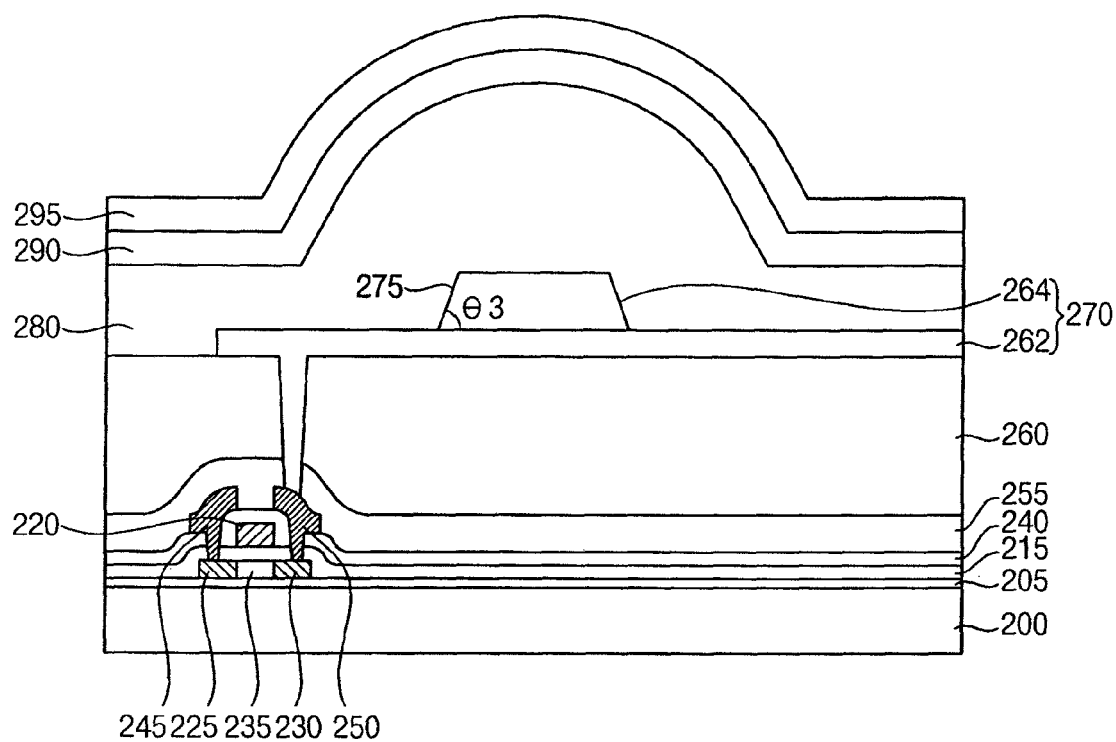

Referring to FIG. 12, the light emitting structure 290 including an organic light emitting layer may be formed on the pixel defining layer 280. The light emitting structure 290 may additionally include a hole injection layer, a hole transfer layer, an electron transfer layer, an electron injection layer, etc. The light emitting structure 290 may be conformingly formed on the pixel defining layer 280 having the protruding portion. The organic light emitting layer of the light emitting structure 290 may include luminescent materials for generating a red color of light, a green color of light or a blue color of light for various pixels of the organic light emitting display device. Alternatively, the organic light emitting layer of the light emitting structure 290 may have a multi layer structure that may include substantially a plurality of stacked luminescent materials for generating a while color of light by mixing a red color of light, a green color of light and a blue color of light. The protruding portion of the pixel defining layer 280 may have the rounded structure, so that the light emitting structure 290 may be uniformly provided on the pixel defining layer 280

The second electrode 295 may be formed on the light emitting structure 290. The second electrode 295 may be formed using a second reflective material such as metal having a reflectivity, alloy having a reflectivity, etc. For example, the second electrode 295 may include aluminum, silver, platinum, gold, chrome, tungsten, molybdenum, titanium, palladium, iridium, alloy thereof, etc. The second electrode 295 may be formed by a printing process, a sputtering process, a chemical vapor deposition process, an atomic layer deposition process, a pulsed laser deposition process, a vacuum evaporation process, etc.

In embodiments, the second reflective material in the second electrode 295 may be substantially the same as or substantially similar to the first reflective material in the second electrode film pattern 264. Alternatively, the second reflective material of the second electrode 295 may be substantially different from the first reflective material of the second electrode film pattern 264.

When the organic light emitting display device has the bottom emission type, the light generated from the light emitting structure 290 and headed toward the nonluminescent region may be reflected by the protrusion structure 275 of the first electrode 270 and also may be reflected by the second electrode 295 toward the substrate 200 in the luminescent region. The second electrode 295 may have a structure substantially the same as or substantially similar to that of the pixel defining layer 280 having the above-described structure, such that the light may be effectively reflected toward the luminescent region by the second electrode 295.

Figure 13:
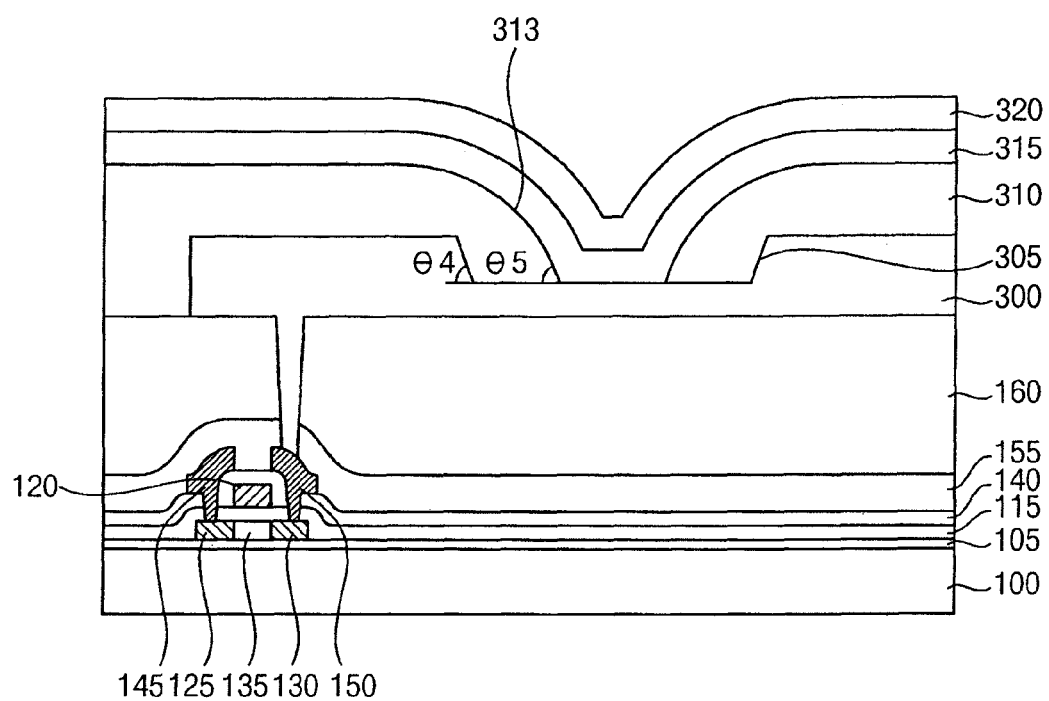
FIG. 13 is a cross-sectional view illustrating an organic light emitting display device in accordance with some embodiments.

FIG. 13 is a cross-sectional view illustrating an organic light emitting display device in accordance with some embodiments. In the organic light emitting display device illustrated in FIG. 13, a substrate 100, a switching device, a first insulation layer 140, a protection layer 155 and a second insulation layer 160 may be substantially the same as or substantially similar to those of the organic light emitting display device described with reference to FIG. 7.

Referring to FIG. 13, the organic light emitting display device may additionally include a first electrode 300, a pixel defining layer 310, a light emitting structure 315, a second electrode 320, etc.

The first electrode 300 may fill a contact hole (not illustrated) formed through the second insulation layer 160 and the protection layer 155, and the first electrode 300 may extend on the second insulation layer 160. The first electrode 300 may include a recess structure 305 located in a luminescent region of the organic light emitting display device. That is, the first electrode 300 may have the recess structure 305 positioned in the luminescent region as a reflection structure for reflecting a light toward the luminescent region.

In embodiments, a first electrode layer (not illustrated) may be formed on the second insulation layer 160 to fill the contact hole exposing a drain electrode 150, and then the first electrode layer may be partially etched to obtain the first electrode 300. In this case, the recess structure 305 may be provided on the first electrode 300 while patterning the first electrode layer. In some embodiments, after forming the first electrode 300 on the second insulation layer 160 by patterning the first electrode layer, the first electrode 300 may be partially etched to form the recess structure 305 thereon.

When the organic light emitting display device has a top emission type, the first electrode 300 may include a reflective material. For example, the first electrode 300 may be formed using reflective metal, reflective alloy, etc. A sidewall of the recess structure 305 of the first electrode 300 may have a fourth angle on inclination ($\theta 4$) with respect to a direction or an axis substantially parallel to an upper face of the substrate 100. For example, the sidewall of the recess structure 305 may have the fourth angle on inclination ($\theta 4$) in a range of about 10° to about 70° relative to the plane, the direction or the axis substantially parallel to the substrate 100. The recess structure 305 may have a depth relatively smaller than a thickness of the first electrode 300, so that the recess structure 305 does not expose the second insulation layer 160.

The pixel defining layer 310 may include an opening 313 that may expose the recess structure 305 of the first electrode 300 in the luminescent region. For example, the opening 313 of the pixel defining layer 310 may entirely or partially expose the recess structure 305. In embodiments, a lower sidewall of the opening 313 of the pixel defining layer 310 may have a fifth angle of inclination ($\theta 5$) relative to the plane, the direction or the axis substantially parallel to the upper face of the substrate 100. In this case, the fifth angle of inclination ($\theta 5$) of the opening 313 may be substantially larger than the fourth angle of inclination ($\theta 4$) of the recess structure 305. For example, the lower sidewall of the opening 313 may have the fifth angle of inclination ($\theta 5$) in a range of about 20° to about 80° with respect to the plane, the direction or the axis substantially parallel to the substrate 100. Additionally, an upper sidewall of the opening 313 may have a substantially rounded shape.

The light emitting structure 315 and the second electrode 320 may be uniformly disposed on the pixel defining layer 310 along a profile of the opening 313. The light emitting structure 315 may include at least one organic light emitting layer, and the second electrode 320 may include a transparent conductive material. In embodiments, an additional protection layer (not illustrated) and/or a substrate (not illustrated) may be disposed on the second electrode 320.

According to embodiments, an organic light emitting display device may include an electrode having a reflection structure and a pixel defining layer having a substantially rounded shape, so that the organic light emitting display device may ensure a greatly increased light efficiency and pixels of the organic light emitting display device may have considerably enhanced uniformities. Therefore, the organic light emitting display device may display images with an improved quality and an increased luminescence to be widely employed in various electric and electronic apparatuses such as televisions, various monitors, recent cellular phones, notebook computers, portable display apparatuses, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An organic light emitting display device comprising:
   a substrate comprising a switching device;
   a first electrode electrically connected to the switching device, the first electrode comprising a first side facing the substrate and a second side facing away from the substrate;
   a pixel defining layer defining a luminescent region and a nonluminescent region;
   an organic light emitting layer; and
   a second electrode disposed over the organic light emitting layer,
   wherein, in a cross-section, the first electrode is recessed on the second side to provide a recess bottom surface, a first recess side surface and a second recess side surface, wherein the organic light emitting layer contacts a central portion of the recess bottom surface and the pixel defining layer contacts a peripheral portion of the recess bottom surface such that the organic light emitting layer does not contact either the first recess side surface or the second recess side surface,
   wherein the first and second recess side surfaces of the first electrode are configured to reflect light beams directed thereto.

2. The organic light emitting display device of claim 1, wherein the first and second recess side surfaces of the first electrode are slanted such that the reflected light beams are directed away from the substrate.

3. The organic light emitting display device of claim 1, wherein the pixel defining layer defines an opening exposing at least a portion of the first electrode.

4. The organic light emitting display device claim 3, wherein the opening of the pixel defining layer comprises a sidewall, and wherein the organic light emitting layer is located over the exposed portion of the first electrode and extends along the sidewall of the pixel defining layer.

5. The organic light emitting display device of claim 1, wherein the first and second recess side surfaces contact the pixel defining layer.

6. The organic light emitting display device of claim 1, wherein the first electrode comprises a sub-layer providing the bottom surface and does not cover the first and second recess side surfaces.

7. The organic light emitting display device of claim 6, wherein the sub-layer is transparent and contacts the organic light emitting layer.

8. The organic light emitting display device of claim 1, wherein the first and second recess side surfaces are inclined with respect to a direction perpendicular to a major surface of the substrate.

9. An organic light emitting display device comprising:
   a substrate comprising a switching device;
   a first electrode electrically connected to the switching device, the first electrode comprising a first side facing the substrate and a second side facing away from the substrate;
   a pixel defining layer defining a luminescent region and a nonluminescent region;
   an organic light emitting layer; and
   a second electrode disposed over the organic light emitting layer,
   wherein, in a cross-section, the first electrode is recessed on the second side to provide a recess bottom surface, a first recess side surface and a second recess side surface, wherein the organic light emitting layer contacts a central portion of the recess bottom surface and the pixel defining layer contacts a peripheral portion of the recess bottom surface such that the organic light emitting layer does not contact either the first recess side surface or the second recess side surface,
   wherein the pixel defining layer further defines an opening exposing at least a portion of the first electrode,
   wherein the first electrode comprises:
      a first electrode film electrically connected to the switching device;
      a second electrode film disposed over the first electrode film;
      the second electrode film being recessed in its central region; and
      a third electrode film disposed in the recessed central region of the second electrode film.

10. The organic light emitting display device of claim 9, wherein each of the first and third electrode films comprises a transparent conductive material.

11. The organic light emitting display device of claim 10, wherein the second electrode film comprises a reflective material.

12. The organic light emitting display device of claim 10, wherein the second electrode comprises the same material as that of at least one of the first and the third electrode films.

13. The organic light emitting display device of claim 9, wherein the first recess side surface has a first acute angle of inclination relative to a plane parallel to the substrate, and wherein the sidewall of the pixel defining layer has a second acute angle of inclination greater than the first acute angle of inclination.

14. The organic light emitting display device of claim 13, wherein a ratio between the first acute angle of inclination and the second acute angle of inclination is in a range of about 0.3:1.0 to about 1.0:4.0.

15. The organic light emitting display device of claim 9, wherein a ratio of a thickness of the first electrode relative to a thickness of the pixel defining layer is below about 1.0.

* * * * *